United States Patent [19]

Christiansen et al.

[11] Patent Number: 4,996,629
[45] Date of Patent: Feb. 26, 1991

[54] CIRCUIT BOARD WITH SELF-SUPPORTING CONNECTION BETWEEN SIDES

[75] Inventors: Robert A. Christiansen, Salvisa; Joel A. DiGirolamo, Lexington, both of Ky.

[73] Assignee: International Business Machines Corporation, Armonk, N.Y.

[21] Appl. No.: 271,242

[22] Filed: Nov. 14, 1988

[51] Int. Cl.⁵ .............................................. H05K 7/02
[52] U.S. Cl. .................................. 361/400; 361/404; 361/408; 361/414; 174/262
[58] Field of Search ............... 361/400, 388, 389, 405, 361/406, 403, 404, 408, 412, 414; 174/262, 261

[56] References Cited

U.S. PATENT DOCUMENTS

| | | | |
|---|---|---|---|
| 3,296,099 | 1/1967 | Dinella | 174/261 X |
| 3,977,074 | 8/1976 | Furnival | 29/625 |
| 3,996,416 | 12/1976 | Lemke | 174/261 |
| 4,864,471 | 9/1989 | Hargasser et al. | 361/400 X |

FOREIGN PATENT DOCUMENTS

| | | | |
|---|---|---|---|
| 2524250 | 9/1983 | France | 361/386 |
| 88/05428 | 7/1988 | PCT Int'l Appl. | |
| 1150530 | 4/1969 | United Kingdom | |
| 2135521 | 8/1984 | United Kingdom | |
| 2153595 | 8/1985 | United Kingdom | |

Primary Examiner—Leo P. Picard
Assistant Examiner—Paramita Ghosh
Attorney, Agent, or Firm—John A. Brady

[57] ABSTRACT

A copper supporting sheet (5) has holes (9) for connecting semiconductor chips (3) to surface mount components (27). A laminate of polyimide (7) has holes (13) corresponding to the supporting layer holes (9) with copper 15 covering those holes (13). In addition to crossing those holes (13), the copper 15 forms conventional circuit patterns. The side having circuit patterns is populated by surface mount techniques with components (27). The opposite side has silicon chips (3) attached to the copper sheet (5) adjacent to holes (9). Wires (17) are ultrasonically bonded to the chips (3) and extended to the inside of the holes (13) in the polyimide layer (7), where they are ultrasonically bonded to copper (15). Crossover connection of the circuit patterns (17a) are achieved using the same technique. The circuit board is densely populated and cost-effective, with good heat dissipation characteristics.

22 Claims, 3 Drawing Sheets

CIRCUIT BOARD WITH SELF-SUPPORTING CONNECTION BETWEEN SIDES

TECHNICAL FIELD

This invention relates to circuit boards populated with circuit elements on opposite sides which are electrically connected through the circuit board. Such boards are thin panels providing structural support for modules, semiconductor chips, and other discrete elements, as well as for circuit leads which are typically thin layers etched from sheet on the circuit board or plated or painted directly on the circuit board. As a practical matter, electrical interconnections between elements on opposite sides of the panel must be by paths through the thin dimension of the circuit board since the alternative is to route wires around the board or off of the board, both of which would defeat the economies of the circuit board by increasing the complexity and the path lengths of the interconnections.

BACKGROUND ART

Such interconnections commonly are by holes through the board (called vias) providing a path which is plated or filled with a conductive material. This may be unsuitable, however, when the circuit board contains an inner metal layer since such a metal layer must be insulated at each via. Such insulation adds expense and creates a potential at each via of minute holes and other imperfections resulting in failures of the circuit board. Since such insulation normally is achieved by plating from a wet bath, insulating such vias is particularly undesirable where the populated circuit board otherwise can be fabricated in a largely dry process since wet baths require steps such as cleaning before immersion, immersion, cleaning after immersion, and drying so as not to contaminate the immersion chemicals during immersion and so as to neutralize or eliminate the residue.

Self-supporting conductors connecting electrical elements across the board are not known to be used commonly, but that is described in U.S. Pat. No. 3,977,074 to Furnival. That connection is by forcing a connecting metal tab through a via and bonding it at the sides of the via, or by bending the wire to be flat on the opposite side of the board, where the bonding is said to be by soldering, resistance welding, or ultrasonic welding, for example.

This invention has particular utility for use with a circuit board having a metal foundation layer, such as copper or aluminum. The purpose of metal as the foundation layer is to dissipate heat rapidly by the metal readily conducting it. The heat is therefore dispersed by the metal layer and thereby readily transferred to the surroundings. With metal as a foundation, circuit elements can be applied with minimal wet chemistry.

Specifically, a thin insulating layer of polyimide can have a copper circuit pattern plated or painted on it, all by conventional techniques. Alternatively, a metal sheet is applied by adhesive on the polyimide layer and the circuit pattern is created by wet etching, as is conventional. Nickel topped with gold is then applied by standard wet plating where contacts are to be made. This lamination is then moved bodily on to the copper foundation sheet, where it is cemented by an adhesive with the circuit pattern outward. Discrete circuit elements are then applied to the circuit pattern by surface mount techniques.

The foundation layer forms no part of the electrical circuitry, although commonly one or more connections are provided to it for connection to ground potential, so that the copper foundation serves as both a heat exchanger and a ground plane. Heat dissipation becomes more important with increasing circuit densities now being realized.

DISCLOSURE OF THE INVENTION

A copper or other metal layer foundation is formed with holes at locations selected for electrical communication of components between two sides of the final circuit board. A laminate of an insulating material, such as polyimide, is formed with holes corresponding in location to the metal foundation holes and with copper bridging one side of the holes. This laminate is bonded to the metal foundation with the metal layers on the outside of the resulting laminate of metal, insulating material, metal. In addition to crossing the holes, the copper on the polyimide forms circuit patterns which are generally entirely conventional. The circuit copper is metallized, preferably with a thin layer of gold, where wire bond connections are to be made.

The side having copper circuit patterns is populated by surface mount techniques with components. The opposite side of the metal foundation has electrical modules, specifically silicon chips or dies, attached to it at preselected locations adjacent to the holes in the foundation metal. One or more self-supporting leads or wires from the chips are positioned through those individual holes and connected to the copper crossing the holes, specifically by ultrasonic welding. The metal crossing the via holes is supported during welding by being placed against a flat surface.

Connections between circuit locations having leads between them (commonly called crossover connections or crossovers) are achieved by wire bonding from two holes as described. This avoids the intermediate leads by locating the crossover connection on the opposite side of the circuit board from the intermediate leads.

Wet chemistry need not be used except for gold plating or like metallization at wire bond locations, and the resulting circuit board is densely populated and cost-effective, while retaining the good heat dissipation characteristics of a metal-foundation circuit board. The silicon chip often may be attached to the metal foundation by a conductive adhesive, which directly connects the silicon chip for optimum heat dissipation from the chip. Additionally, efficiencies may be realized from the use of existing technologies for forming the lamination and bonding the wires.

BRIEF DESCRIPTION OF THE DRAWING

The details of this invention will be described in connection with the accompanying drawing, in which.

BEST MODE FOR CARRYING OUT THE INVENTION

Figure 1:
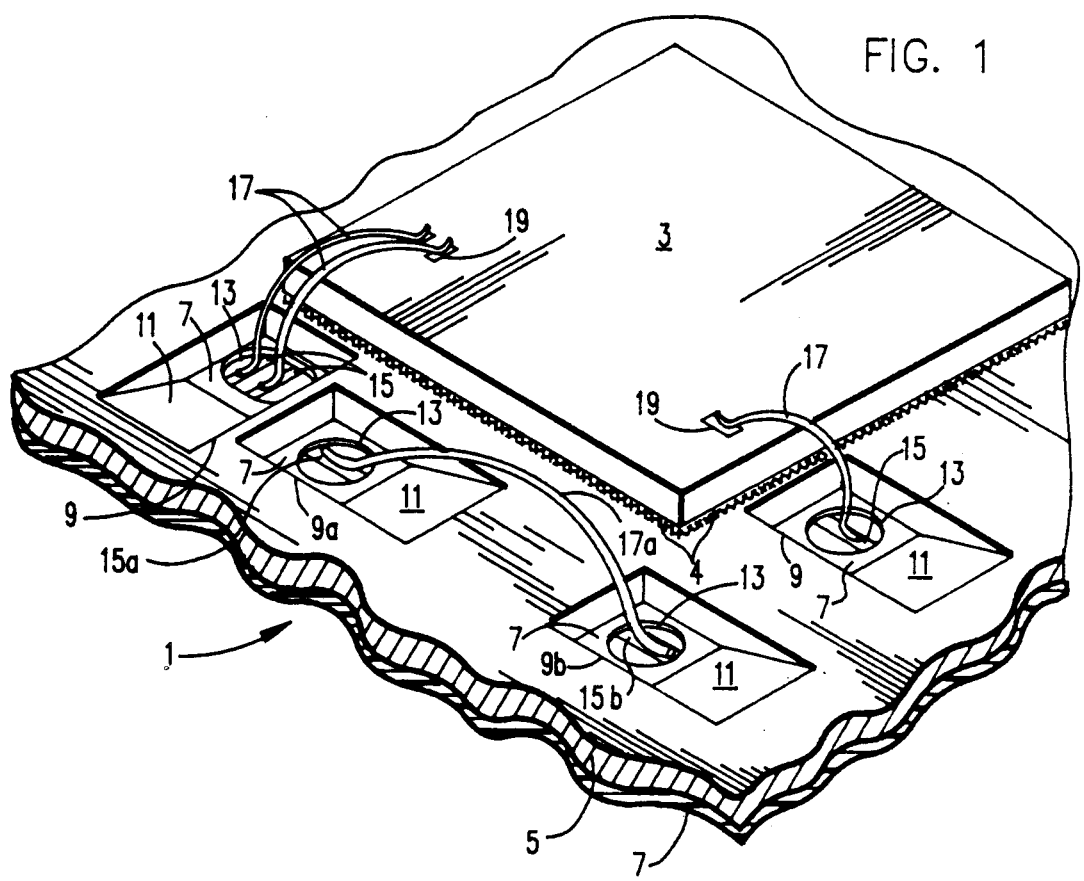
FIG. 1 is a perspective view of a part of a populated circuit board in accordance with this invention viewed from the copper foundation side.

FIG. 1 is a broken out view of a much larger circuit board 1 selected to show one standard silicon die or chip 3, which could be, for example, a motor driver or other high-power-source circuit, or an entire high-power electrical system. Chip 3 is bonded by adhesive 4 to a copper sheet 5, typically 0.010-0.060 inch thick (approximately 0.0254 cm to 0.1524 cm). Copper sheet 5 is the structural foundation for circuit board 1 and further serves as heat sink for heat from circuit elements. A typically 1 to 2 mil (approximately 0.00254 to 0.00508 cm) thick lamination of polyimide 7 is bonded to foundation sheet 5. (Thickness of 1 mil is generally adequate being increased from 1 mil to satisfy physical or dielectric requirements.)

Foundation sheet 5 has holes 9 fabricated in it, which may be by standard metal forming techniques such as electrical discharge machining or stamping. Each hole 9 in this embodiment has a ramp 11 which results in each hole 9 being larger on the side supporting chip 3 than on the side at which the hole 9 contacts polyimide 7. This formation is to leave room for the ultrasonic wire bonding tool as will be described, and holes 9 are therefore larger than the holes 13 in polyimide 7. As much metal of sheet 5 as possible is left at each hole 9 so that sheet 5 can perform its primary functions of providing physical support and dissipating heat.

Figure 2:
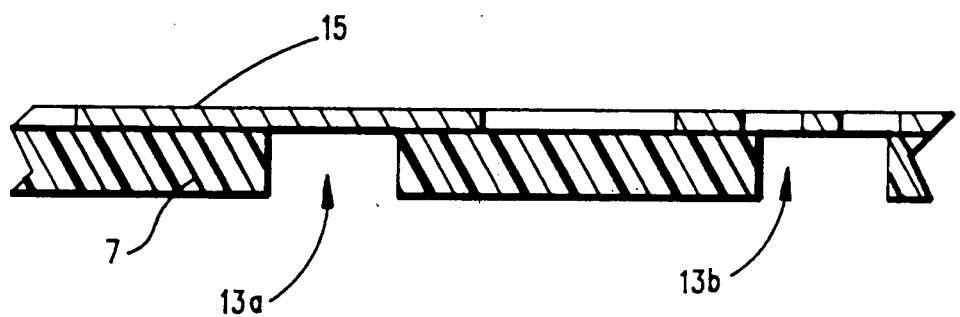
FIG. 2 is a cross section of the laminate of polyimide and copper circuit patterns prior to application on a metal foundation.

Holes 13 in polyimide 7 have extending across them copper 15 on the opposite side of circuit board 1 from that shown in FIG. 1. This is shown more clearly in FIG. 2, which shows in cross section the laminate of polyimide layer 7 and copper 15 which is an intermediate element employed in fabricating the circuit board 1. The elements of FIG. 2 are a polyimide layer 7, polyimide being an electrical insulator, having bonded to it copper 15, the copper 15 being in the form of the leads of an electrical circuit. The vertical lines in copper 15 are to signify that copper 15 forms circuit patterns and is not continuous, although copper 15 does extend across each hole 13. FIG. 2 is particularly illustrative in that the single cross section includes the center of a hole 13a having copper 15 bridging it across the cross section and the center of a holes 13b having copper 15 bridging it perpendicular to the cross section, while this would rarely occur in a single cross section.

The fabrication of the polyimide and copper laminate of FIG. 2 forms no part of this invention, and such fabrication is available commercially as the resulting article is very similar technologically to standard flexible circuits. Broadly, fabrication could be by bonding the copper 15 by adhesive initially as an uninterrupted sheet on an uninterrupted sheet of polyimide 7 having holes 13 punched from it. (Alternatively, the sheet 7 is uninterrupted and the pattern of holes 13 is defined by standard optical techniques as a resist pattern on polyimide 7, and polyimide 7 not covered by the pattern is etched away in a wet immersion process.) Then the circuit pattern for the copper is defined by standard optical techniques as a resist pattern, and copper not covered by the pattern is etched away in a wet immersion process. The item is then cleaned and locations to receive wire bonding, specifically the bridging portions of copper 15 at holes 13 are metallized by standard immersion plating, such as by nickel followed by an outer layer of gold. (Typically areas not to take wire bonds are masked and not plated.) This metallization to gold is shown as a single thin layer 16 in FIG. 3 and FIG. 4. Finally, the item is cleaned and dried. The resulting element is a sheet at least essentially coextensive with the surface of circuit board 1 having a cross section consistent with FIG. 2.

The laminate of polyimide 7 and copper 15 of FIG. 2 is adhesively bonded on copper sheet 5. Holes 13 in polyimide 7 are positioned to correspond to the holes 9 and to be spaced from the ramp 11. Then circuit chips 3 and other chips as may be required for the final circuit board are attached to foundation 5 also by a standard die bond adhesive 4, such as, for example epoxy or polyimide based adhesive, the polyimide being used for increased thermal stability. Adhesive 4 typically will be filled with conductive filler, such as powdered metal, to render the adhesive readily conductive both to electrical currents and to heat. This can be done when the foundation sheet 5 will be contacted to ground potential and when the chip 3 is designed to have its bottom plane at ground potential. Where the chip 3 is not suited to such ground potential and sheet 5 will be grounded, the adhesive is selected to be as thermally conductive as possible while being an electrical insulator.

Figure 3:
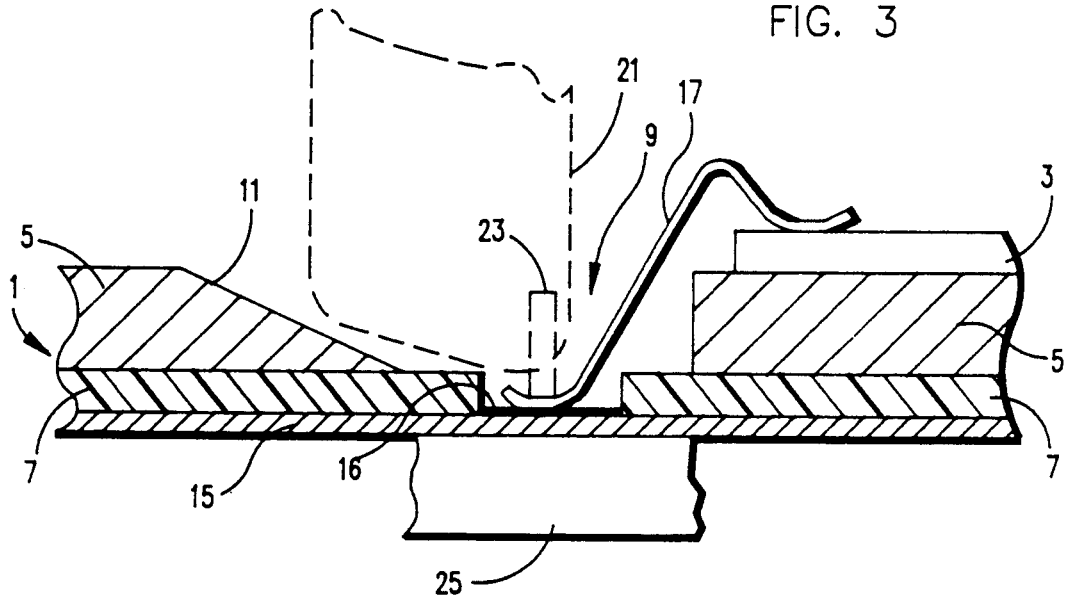
FIG. 3 is illustrative of an intermediate stage of production and of the openings in relation to the ultrasonic wire bond tool used to bond the electrical wires.
Figure 4:
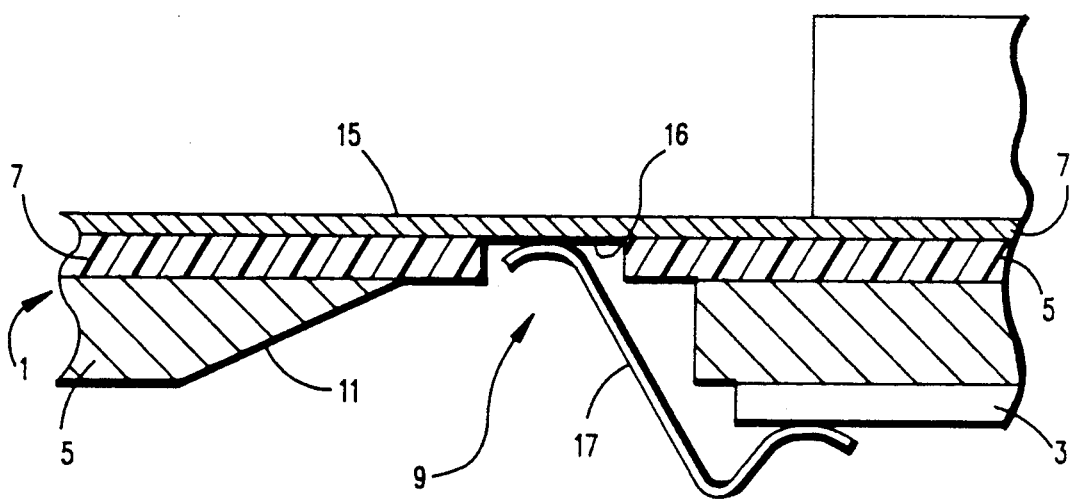
FIG. 4 is a cross section of a populated circuit board.

Standard aluminum conductive wires 17 are then bonded from contact terminals 19 of the chips 3. FIG. 3 is illustrative of this operation showing the wire bonding apparatus 21 (illustratively, in dotted outline) within a hole 9 generally where it is positioned to bond one end of wire 17 to copper 15. The shape and relative size of bonding apparatus 21 shown in FIG. 3 is roughly that of commercial bonding equipment selected for use with this embodiment. It is therefore apparent that ramp 11 can be provided rather than further enlarging hole 9, since bonding apparatus 21 slopes upward on one side. Nevertheless, hole 9 is relatively large compared to hole 13 to accommodate apparatus 21.

Apparatus 21 may be a Mech-El-Industries Inc. 2909A automatic wedge bonder. This device grasps the wire 17 from a supply source, moves vertically and horizontally to position wire 17 and an ultrasonic welding wedge 23 at locations for bonding, then moves wedge 23 down and activates it ultrasonically to effect welding. The device then moves vertically and horizontally while letting the wire slip through it to position wedge 23 and another part of wire 17 at a second predetermined location for bonding, where wedge 23 is again moved down and activated to effect ultrasonic welding. Finally, the device grasps wire 17 and severs it at the second bond, leaving a part of wire 17 connected between the two points, such a final connection being shown in FIG. 3. The foregoing ultrasonic bonding may be by operator control or under the automatic control of a microprocessor, and, for the purposes of this embodiment, is entirely as is commonly known in the art.

During such ultrasonic bonding copper 15 at holes 9 is physically supported from the bottom by a flat surface 25 upon which the assembly carrying chip 3 rests by gravity or vacuum. Surface 25 may be a large table top or other flat surface, which may be coextensive with the entire circuit board 1.

With the completion of wire bonding and removal of bonding apparatus for the entire circuit board 1, the side of the circuit board 1 having chips 3 is passivated by standard techniques. Passivation is basically an encapsulation by a protective film (such as polyparaxylylene for example), which may be by vapor deposition or by a dome forming (often denominated "glob top") material such as a filled epoxy. Passivation for this embodiment preferably is by an epoxy glob, separately covering each chip 3.

Figure 5:
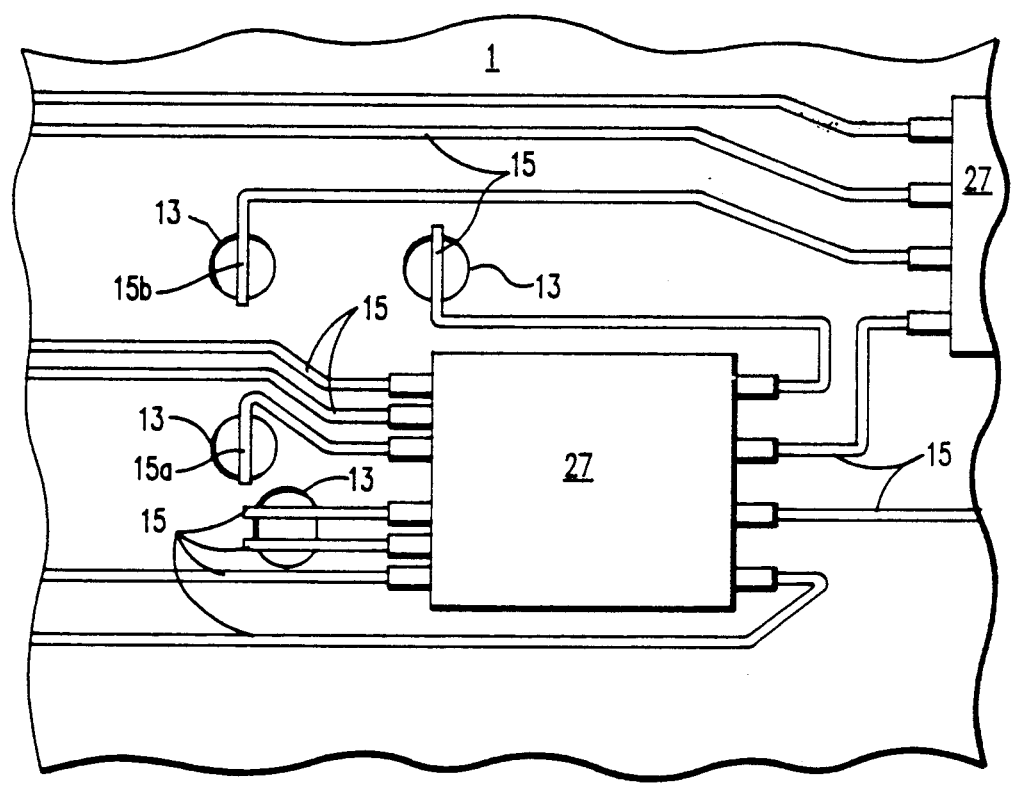
FIG. 5 is a plan view of part of the populated circuit board from the side having surface mount elements.

The circuit board 1 is then reversed so that the copper 15 is upward, and the circuit board 1 is processed through a standard surface mount production line, where surface mount elements 27 are positioned on solder islands and then bonded into place with attachment to the surface only by reflowing the solder. The surface mount operation for this embodiment may be entirely conventional. FIG. 5 illustrates a part of the populated card viewed toward the surface mount elements 27. Leads formed by copper 15 form standard circuit interconnections, while parts of copper 15 crossing holes 13 are those parts located at holes 9 and bonded to chips 3 by wires 17.

Holes 9a and 9b (FIG. 1) illustrate a crossover connection in accordance with this invention. Wire 17a, between holes 9a and 9b and wire bonded as discussed in connection with the other holes 9, completely avoid leads of copper 15, between leads of copper 15a and 15b on the opposite side. This can be very cost effective since crossing such a connection on the opposite side would entail adding a layer of electrically insulating material.

Accordingly, the board is populated with circuit elements on both sides, while still having a large, distributed copper foundation 5 effective to dissipate heat. A circuit board 1 being populated on both sides necessarily can be smaller than a single sided board with the same components. The chips 3 are connected directly to copper 5, which facilitates the intended function of copper 5 being a heat sink for chips 3. No extra material is needed to accommodate chips 3. Finally, this embodiment is particularly efficient for current implementations since it utilizes established practical and efficient technologies.

Variations within the spirit and substance of this invention will be apparent, and embodiments employing the spirit and substance of this invention can be anticipated. Accordingly, patent coverages of corresponding scope is sought as provided by law with particular reference to the accompanying claims.

We claim:

1. A circuit board populated on opposite sides comprising a supporting layer having two sides and holes between said two sides, a conductive circuit pattern supported on one of said sides, said conductive circuit pattern crossing said holes and defining a bottom of each of said holes, circuit elements supported on the other of said sides and wires or other self-supporting conductors electrically connected to said circuit elements, extending through said holes, and bonded to said conductive pattern on the side of said conductive pattern facing said holes where said conductive pattern crosses said holes, and not extending past said bottom of said holes.

2. A circuit board as in claim 1 in which said circuit elements comprise semiconductor chips bonded to said supporting layer and having terminals spaced from said bonded location, said wires or connectors being connected to said terminals.

3. A circuit board as in claim 2 in which further circuit elements are mounted on and electrically connected to said conductive circuit pattern by surface attachment.

4. A circuit board as in claim 3 also comprising a single wire or other self-supporting conductor electrically connecting two locations of said circuit pattern crossing two of said holes, said single wire or connector extending through each of said two holes, and being bonded to said conductive pattern on the side of said conductive pattern facing each of said two holes where said conductive pattern crosses said holes, and not extending past said bottom of said holes.

5. A circuit board as in claim 2 also comprising a single wire or other self-supporting conductor electrically connecting two locations of said circuit pattern crossing two of said holes, said single wire or connector extending through each of said two holes, and being bonded to said conductive pattern on the side of said conductive pattern facing each of said two holes where said conductive pattern crosses said holes, and not extending past said bottom of said holes.

6. A circuit board as in claim 1 in which further circuit elements are mounted on and electrically connected to said conductive circuit pattern by surface attachment.

7. A circuit board as in claim 6 also comprising a single wire or other self-supporting conductor electrically connecting two locations of said circuit pattern crossing two of said holes, said single wire or connector extending through each of said two holes, and being bonded to said conductive pattern on the side of said conductive pattern facing each of said two holes where said conductive pattern crosses said holes, and not extending past said bottom of said holes.

8. A circuit board as in claim 1 also comprising a single wire or other self-supporting conductor electrically connecting two locations of said circuit pattern crossing two of said holes, said single wire or connector extending through each of said two holes, and being bonded to said conductive pattern on the side of said conductive pattern facing each of said two holes where said conductive pattern crosses said holes, and not extending past said bottom of said holes.

9. A circuit board comprising a metal supporting layer having two sides, an electrically insulating layer on one of said sides, holes between said sides and extending through said insulting layer, circuit elements supported on the other of said sides, a conductive circuit pattern supported on said insulating layer separated from said metal layer by said insulating layer, said conductive circuit pattern crossing said holes and defining a bottom of each of said holes, and wires or other self-supporting conductors electrically connected to said circuit elements, extending through said holes, and bonded to said conductive pattern on the side of said conductive pattern facing said holes where said conductive pattern crosses said holes, and not extending past said bottom of said holes.

10. A circuit board as in claim 9 in which said circuit elements comprise semiconductor chips bonded to said supporting layer and having terminals spaced from said bonded location, said wires being connected to said terminals.

11. A circuit board as in claim 10 in which said circuit elements are bonded to said supporting layer by electrically conductive adhesive, said chips being connected electrically to said adhesive.

12. A circuit board as in claim 11 in which further circuit elements are mounted on and electrically connected to said conductive pattern by surface attachment.

13. A circuit board as in claim 12 also comprising a single wire or other self-supporting conductor electrically connecting two locations of said circuit pattern crossing two of said holes, said single wire or connector extending through each of said two holes, and being bonded to said conductive pattern on the side of said conductive pattern facing each of said two holes where said conductive pattern crosses said holes, and not extending post said bottom of said holes.

14. A circuit board as in claim 11 also comprising a single wire or other self-supporting conductor electrically connecting two locations of said circuit pattern crossing two of said holes, said single wire or connector extending through each of said two holes, and being bonded to said conductive pattern on the side of said conductive pattern facing each of said two holes where said conductive pattern crosses said holes, and not extending post said bottom of said holes.

15. A circuit board as in claim 10 in which further circuit elements are mounted on and electrically connected to said conductive pattern by surface attachment.

16. A circuit board as in claim 15 also comprising a single wire or other self-supporting conductor electrically connecting two locations of said circuit pattern crossing two of said holes, said single wire or connector extending through each of said two holes, and being bonded to said conductive pattern on the side of said conductive pattern facing each of said two holes where said conductive pattern crosses said holes, and not extending post said bottom of said holes.

17. A circuit board as in claim 10 also comprising a single wire or other self-supporting conductor electrically connecting two locations of said circuit pattern crossing two of said holes, said single wire or connector extending through each of said two holes, and being bonded to said conductive pattern on the side of said conductive pattern facing each of said two holes where said conductive pattern crosses said holes, and not extending post said bottom of said holes.

18. A circuit board as in claim 9 in which further circuit elements are mounted on and electrically connected to said conductive pattern by surface attachment.

19. A circuit board as in claim 18 also comprising a single wire or other self-supporting conductor electrically connecting two locations of said circuit pattern crossing two of said holes, said single wire or connector extending through each of said two holes, and being bonded to said conductive pattern on the side of said conductive pattern facing each of said two holes where said conductive pattern crosses said holes, and not extending post said bottom of said holes.

20. A circuit board as in claim 9 also comprising a single wire or other self-supporting conductor electrically connecting two locations of said circuit pattern crossing two of said holes, said single wire or connector extending through each of said two holes, and being bonded to said conductive pattern on the side of said conductive pattern facing each of said two holes where said conductive pattern crosses said holes, and not extending post said bottom of said holes.

21. A circuit board populated on opposite sides comprising a supporting layer having two sides and holes between said two sides, a conductive circuit pattern supported on one of said sides, said conductive circuit pattern crossing said holes and defining a bottom of each of said holes, circuit elements supported on the other of said sides, and a single wire or other self-supporting conductor electrically connecting two locations of said circuit pattern crossing two of said holes, said single wire or connector extending through each of said two holes and being bonded to said conductive pattern on the side of said conductive pattern facing each of said two holes where said conductive pattern crosses said holes, and not extending past said bottom of said holes.

22. A circuit board comprising a metal supporting layer having two sides, an electrically insulating layer on one of said sides, holes between said sides and extending through said insulating layer, circuit elements supported on the other of said sides, a conductive circuit pattern supported on said insulating layer separated from said metal layer by said insulating layer, said conductive circuit pattern crossing said holes and defining a bottom of each of said holes, and a single wire or other self-supporting conductor electrically connecting two locations of said circuit pattern crossing two of said holes, said single wire or connector extending through each of said two holes and being bonded to said conductive pattern on the side of said conductive pattern facing said holes where said conductive pattern crosses said holes, and not extending past said bottom of said holes.

* * * * *